United States Patent
Liu et al.

(10) Patent No.: US 12,501,694 B2
(45) Date of Patent: Dec. 16, 2025

(54) SEMICONDUCTOR DEVICE AND METHOD FOR FORMING THE SAME

(71) Applicant: UNITED MICROELECTRONICS CORP., Hsin-Chu (TW)

(72) Inventors: Shi-You Liu, Kaohsiung (TW); Ming-Shiou Hsieh, Chiayi County (TW); Zih-Hsuan Huang, Tainan (TW); Tsai-Yu Wen, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 460 days.

(21) Appl. No.: 17/131,584

(22) Filed: Dec. 22, 2020

(65) Prior Publication Data

US 2022/0157814 A1  May 19, 2022

(30) Foreign Application Priority Data

Nov. 18, 2020 (CN) .......................... 202011293784.3

(51) Int. Cl.
*H10D 84/01* (2025.01)
*H10D 84/03* (2025.01)
*H10D 84/85* (2025.01)

(52) U.S. Cl.
CPC ......... *H10D 84/85* (2025.01); *H10D 84/0181* (2025.01); *H10D 84/038* (2025.01)

(58) Field of Classification Search
CPC ...... H01L 27/092–0928; H01L 21/8238–8239
See application file for complete search history.

(56) References Cited

U.S. PATENT DOCUMENTS

| | | | | |
|---|---|---|---|---|
| 5,763,922 A * | 6/1998 | Chau | ................... | H01L 27/0922 257/E21.639 |
| 6,468,851 B1 * | 10/2002 | Ang | ................ | H01L 21/823842 438/231 |
| 6,764,898 B1 | 7/2004 | En | | |
| 7,867,839 B2 | 1/2011 | Chen | | |
| 2002/0063294 A1 * | 5/2002 | Brown | ................. | H01L 29/105 257/E21.345 |
| 2002/0063295 A1 * | 5/2002 | Ando | ................. | H01L 27/0922 257/E21.639 |

(Continued)

FOREIGN PATENT DOCUMENTS

KR       20140083736 A   *   7/2014

OTHER PUBLICATIONS

Machine translation of KR 20140083736 A (Year: 2014).*

(Continued)

*Primary Examiner* — Bryan R Junge
(74) *Attorney, Agent, or Firm* — Winston Hsu

(57) ABSTRACT

A semiconductor device includes a substrate having a P-type device region and an N-type device region, wherein the P-type device region includes germanium dopants. A first gate oxide layer is formed on the P-type device region and a second gate oxide layer is formed on the N-type device region. The first gate oxide layer and the second gate oxide layer are formed through a same oxidation process. The first gate oxide layer includes nitrogen dopants and the second gate oxide layer does not include the nitrogen dopants.

7 Claims, 4 Drawing Sheets

(56) References Cited

U.S. PATENT DOCUMENTS

| | | | | |
|---|---|---|---|---|
| 2002/0163011 A1* | 11/2002 | Lee | .................... | H10D 84/0181 |
| | | | | 257/E21.639 |
| 2005/0003618 A1* | 1/2005 | Kanda | ............. | H01L 21/823462 |
| | | | | 438/275 |
| 2005/0280097 A1* | 12/2005 | Anderson | ............ | H10D 84/038 |
| | | | | 257/E21.639 |
| 2006/0046415 A1* | 3/2006 | Hamaguchi | ....... | H01L 21/26506 |
| | | | | 257/E21.345 |
| 2012/0244670 A1* | 9/2012 | Do | ....................... | H10D 62/822 |
| | | | | 257/E21.409 |
| 2014/0042500 A1* | 2/2014 | Wann | ................. | H01L 29/4958 |
| | | | | 257/770 |
| 2015/0069493 A1* | 3/2015 | Murakoshi | ............ | H01L 29/511 |
| | | | | 257/316 |
| 2016/0056283 A1* | 2/2016 | Suzuki | ................. | H01L 21/045 |
| | | | | 257/77 |

OTHER PUBLICATIONS

Ludsteck et al. 'Thermally grown and reoxidized nitrides as alternative gate dielectric,' 2004, Mat. Res. Soc. Symp. Proc., vol. 786, E3.14.1-E3.14.6 (Year: 2004).*

Miura et al., Reoxidation effects on the chemical bonding states of nitrogen accumulated at the oxynitride/silicon interface, Jul. 10, 2000, Applied Physics Letters, vol. 77, No. 2, pp. 220-222 (Year: 2000).*

* cited by examiner

SEMICONDUCTOR DEVICE AND METHOD FOR FORMING THE SAME

BACKGROUND OF THE INVENTION

1. Field of the Invention

The present invention generally relates to a semiconductor device and method for forming the same. More particularly, the present invention relates to a complementary metal-oxide-semiconductor (CMOS) device and method for forming the same.

2. Description of the Prior Art

A complementary metal-oxide-semiconductor (CMOS) device is a kind of semiconductor device that has PMOS (p-type metal-oxide-semiconductor) transistors and NMOS (n-type metal-oxide-semiconductor) transistors integrally formed on a substrate (or wafer) to construct an integrated circuit through a series of manufacturing process steps. A CMOS device may be used for microprocessors, microcontrollers, static random access memories (SRAM) and other digital logic-circuits.

The process of integrally forming the PMOS transistors and the NMOS transistors usually includes implanting different types of dopants into different device regions of the substrate in order to make the PMOS transistors and the NMOS transistors meet their respective electrical requirements. However, different doping conditions may cause influences on subsequent manufacturing steps. For example, different doping conditions may cause different oxidation rates in different device regions during the thermal oxidation processes.

The difference in the thicknesses of the oxide layers on different device regions of the substrate caused by the different oxidation rates will gradually accumulate as the overall thicknesses of the oxide layers increase. As a result, the difference in the thicknesses of the thick gate oxide layers on different high-voltage (HV) device regions and having thicknesses of hundreds of angstroms (Å) or even several micrometers (um) may be particularly obvious. A large difference in the thicknesses of the gate oxide layers not only influences the process window of subsequent manufacturing steps, such as gate-height control, but also causes difficulties to fulfill respective electrical requirements of the PMOS transistors and the NMOS transistors.

SUMMARY OF THE INVENTION

In light of the above, the present invention is directed to provide a semiconductor device and method for forming the same, which particularly introduces germanium dopants and nitrogen dopants into the P-type device region of the substrate, thereby obtaining an oxidation rate of the P-type device region of the substrate comparable to an oxidation rate of the N-type device region of the substrate. Accordingly, the thicknesses of the gate oxide layer on the P-type device region of the substrate and the gate oxide layer on the N-type device region of the substrate may be approximately the same.

In one embodiment of the present invention, a semiconductor device is disclosed. The semiconductor device includes a substrate having a P-type device region and an N-type device region, wherein the P-type device region comprises germanium dopants. The semiconductor device further includes a first gate oxide layer formed on the P-type device region and a second gate oxide layer formed on the N-type device region, wherein the first gate oxide layer and the second gate oxide layer are formed through a same oxidation process, the first gate oxide layer comprises nitrogen dopants, and the second gate oxide layer does not comprise the nitrogen dopants.

In another embodiment of the present invention, a method for forming a semiconductor device is disclosed and includes the following steps. First, a substrate having a P-type device region and an N-type device region is provided. After that, a doped layer is formed in the P-type device region of the substrate, wherein an upper portion of the doped layer comprises nitrogen dopants, and a lower portion of the doped layer comprises germanium dopants. Subsequently, a first oxidation process is performed to form a first oxide layer on the doped layer in the P-type device region and a second oxide layer on the N-type device region of the substrate. Afterward, a second oxidation process is performed to oxidize the substrate through the first oxide layer and the second oxide layer, thereby forming a first gate oxide layer on the P-type device region of the substrate and a second gate oxide layer on the N-type device region of the substrate, wherein the first gate oxide layer comprises the nitrogen dopants.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
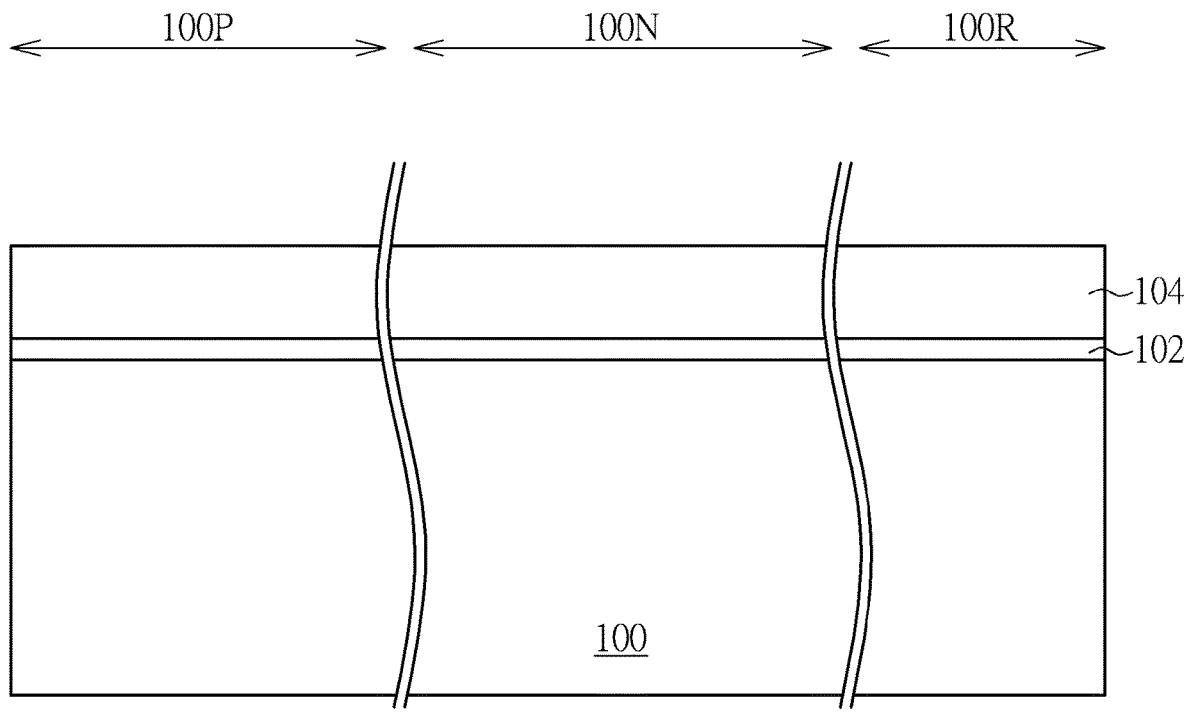
FIG. 1 to FIG. 8 are schematic cross-sectional diagrams illustrating the steps of a method of forming a semiconductor device according to an embodiment of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments. These embodiments are described in sufficient detail to enable those skilled in the art to practice the invention. Other embodiments may be utilized and that structural, logical and electrical changes may be made without departing from the spirit and scope of the present invention.

FIG. 1 to FIG. 8 are schematic cross-sectional diagrams illustrating the steps of a method of forming a semiconductor device according to an embodiment of the present invention.

Please refer to FIG. 1. First, a substrate 100 is provided. The substrate 100 includes a P-type device region 100P, an N-type device region 100N, and a peripheral region 100R. The substrate 100 may be a silicon substrate, an epitaxial silicon substrate, a silicon germanium (SiGe) semiconductor substrate, a silicon carbide (SiC) substrate, or a silicon-oninsulator (SOI) substrate, but is not limited thereto. In some embodiments, the substrate 100 may be a silicon substrate. As shown in FIG. 1, a pad layer 102 may be formed on the substrate 100. A hard mask layer 104 may be formed on the pad layer 102. According to an embodiment of the present invention, the pad layer 102 may be a silicon oxide ($SiO_2$) layer, and the hard mask layer 104 may be a silicon nitride (SiN) layer, but are not limited thereto.

Figure 2:
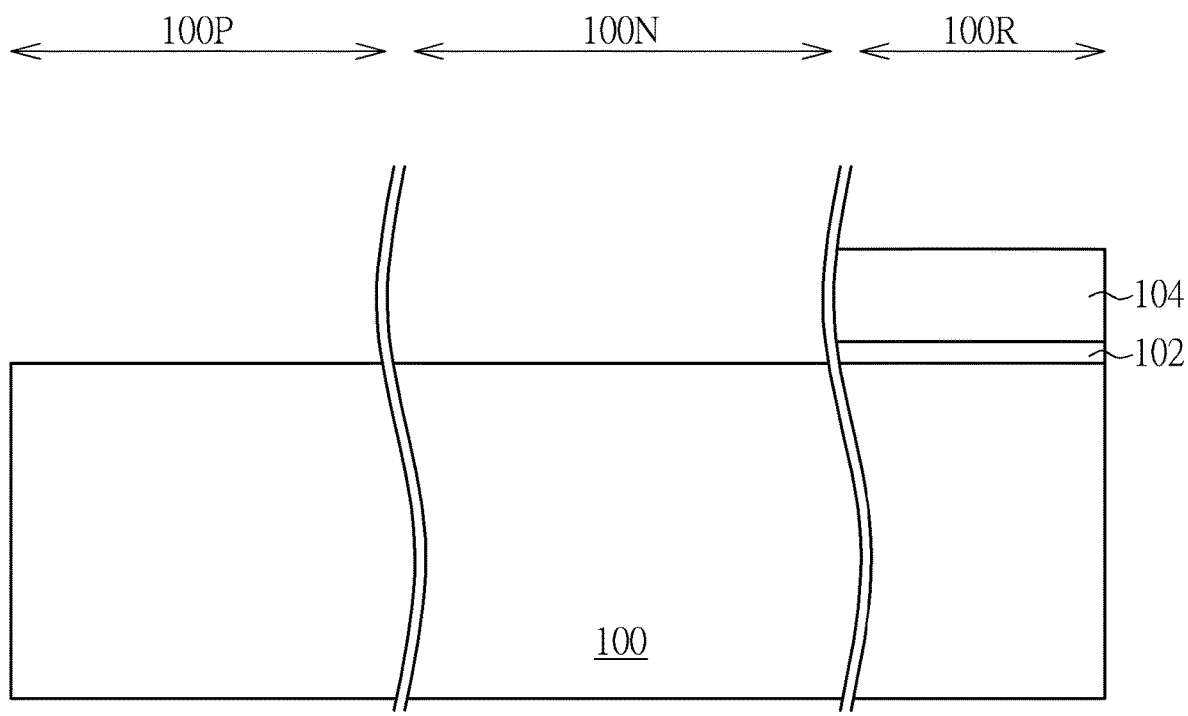

Please refer to FIG. 2. Subsequently, the pad layer 102 and the hard mask layer 104 on the P-type device region 100P and the N-type device region 100N are removed to expose a surface of the substrate 100. In some embodiments, the process for removing the pad layer 102 and the hard mask layer 104 may include forming a patterned mask layer (not shown) covering the hard mask layer 104 on the peripheral region 100R of the substrate 100 and exposing the hard mask layer 104 on the P-type device region 100P and on the N-type device region 100N of the substrate 100. After that, a wet etching process or a dry etching process may be performed to remove the exposed hard mask layer 104 and the pad layer 102 thereunder. In some embodiments, after removing the pad layer 102, the surface of the substrate 100 may have a native oxide layer.

Figure 3:
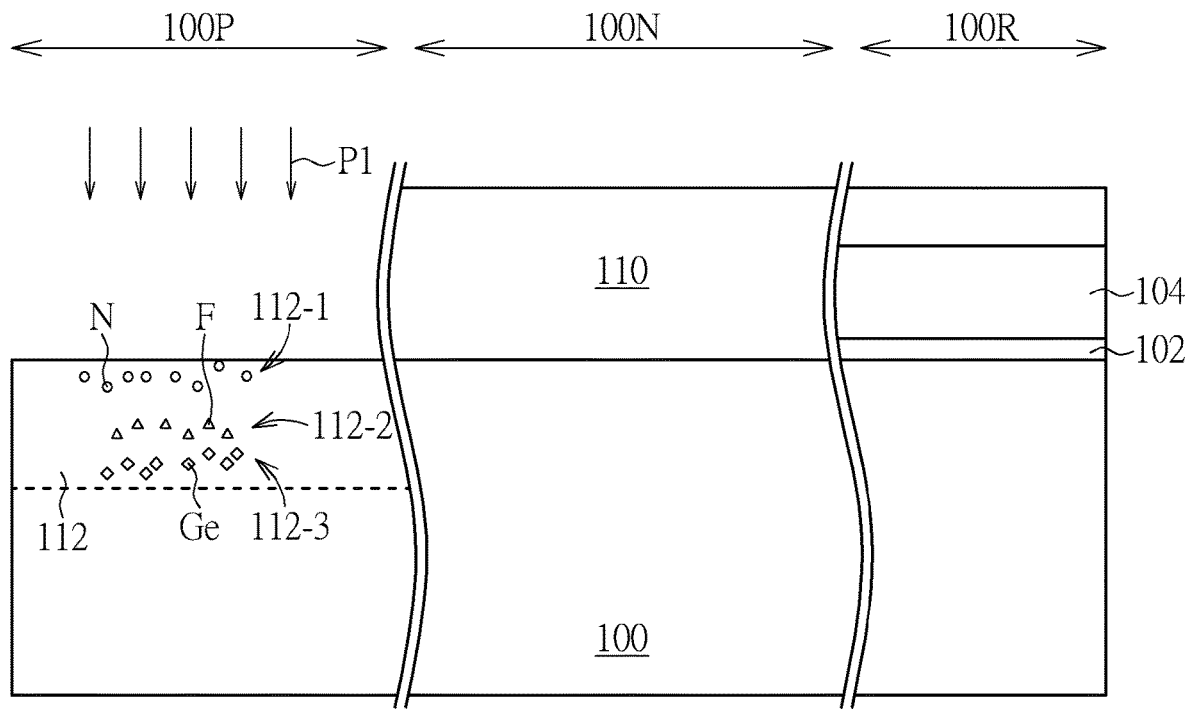

Please refer to FIG. 3. Subsequently, a patterned mask layer 110 is formed on the substrate 100 and covering the N-type device region 100N and the peripheral region 100R. The P-type device region 100P of the substrate 100 is exposed from the patterned mask layer 110. According to an embodiment, the patterned mask layer 110 may be a photoresist layer, but is not limited thereto. Following, an implantation process P1 is performed, using the patterned mask layer 110 as an implantation mask to form a doped layer 112 in the P-type device region 100P and near the surface of the substrate 100.

More specifically, during the implantation process P1, nitrogen dopants N and germanium dopants Ge are implanted into the P-type device region 100P of the substrate 100. According to a preferred embodiment, by adjusting the implanting energy for implanting the nitrogen dopants N and the germanium dopants Ge, most or a majority of the nitrogen dopants N are located in the upper portion 112-1 of the doped layer 112, and most or a majority of the germanium dopants Ge are located in the lower portion 112-3 of the doped layer 112. In other words, the upper portion 112-1 of the doped layer 112 has the nitrogen dopants N in a concentration higher than other portions of the doped layer 112 do. The lower portion 112-3 of the doped layer 112 has the germanium dopants Ge in a concentration higher than other portions of the doped layer 112 do. According to an embodiment of the present invention, the implanting energy and the implanting dosage for implanting the germanium dopants Ge may be approximately 40 KeV and 5e15 atoms/$cm^2$, but are not limited thereto. The implanting energy and the implanting dosage for implanting the nitrogen dopants N may be approximately 2 KeV and 1e15 atoms/$cm^2$, but are not limited thereto.

In some embodiments of the present invention, during the implantation process P1, fluorine dopants F are implanted into the P-type device region 100P of the substrate 100, and most or a majority of the fluorine dopants F are preferably located in the middle portion 112-2 of the doped layer 112. In other words, the middle portion 112-2 of the doped layer 112 has the fluorine dopants F in a concentration higher than other portions of the doped layer 112 do. Most of the fluorine dopants F are located between the nitrogen dopants N and the germanium dopants Ge. According to an embodiment of the present invention, the implanting energy and the implanting dosage for implanting the fluorine dopants F may be approximately 28 KeV to 42 keV and 5e14 atoms/$cm^2$, but are not limited thereto.

It should be noted that, the germanium dopants Ge, the nitrogen dopants N, and the fluorine dopants F shown in the drawings are used to illustrate the major distributions thereof in the doped layer 112. In some embodiments of the present invention, some or a minority of the nitrogen dopants N may be located in the middle portion 112-2 and/or the lower portion 112-3 of the doped layer 112, some or a minority of the germanium dopants Ge may be located in the upper portion 112-1 and/or the middle portion 112-2 of the doped layer 112, and some or a minority of the fluorine dopants F may be located in the upper portion 112-1 and/or lower portion 112-3 of the doped layer 112.

According to an embodiment of the present invention, during the implantation process P1, suitable well dopants may be implanted into the P-type device region 100P of the substrate 100 to form a well region (not shown).

Figure 4:
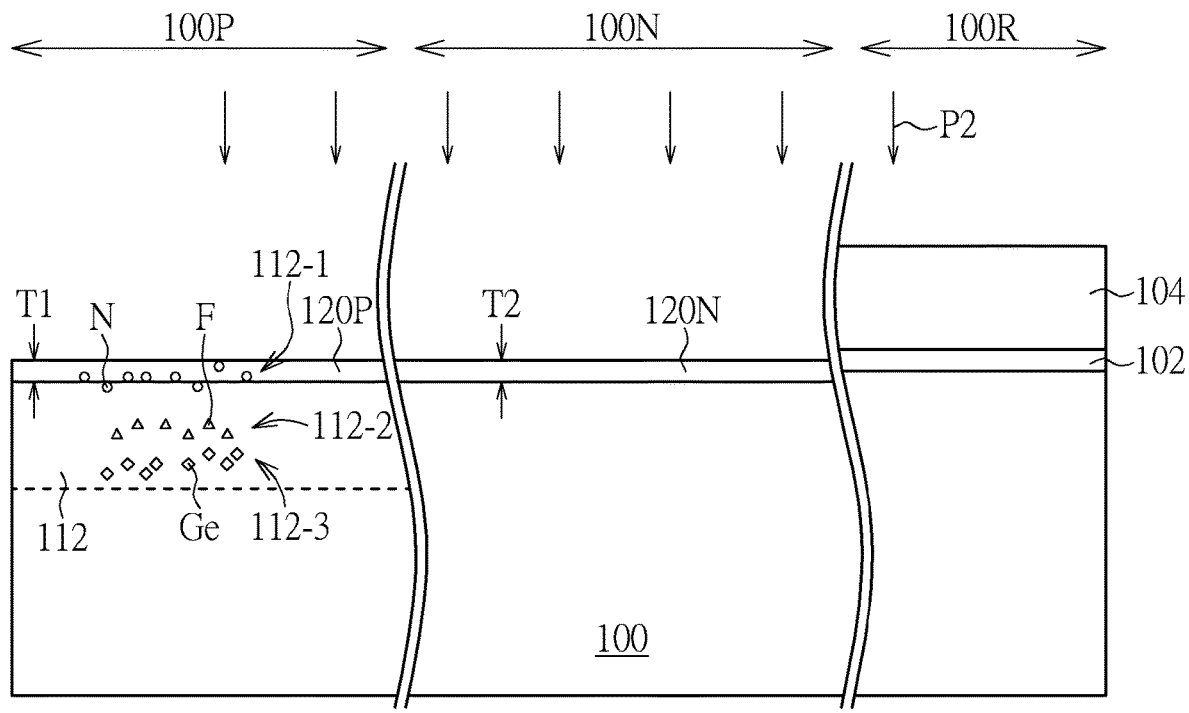

Please refer to FIG. 4. Subsequently, the patterned mask layer 110 is removed and the surface of the N-type device region 100N of the substrate 100 is exposed. Following, the substrate 100 is placed in an oxygen-containing ambient and a first oxidation process P2 is performed to form a first oxide layer 120P on the doped layer 112 in the P-type device region 100P of the substrate 100 and a second oxide layer 120N on the surface of the N-type device region 100N of the substrate 100. In some embodiments of the present invention, the oxygen-containing ambient may be obtained by supplying oxygen or oxygen-containing gas (such as water vapor) into the processing chamber of the first oxidation process P2. In some embodiments of the present invention, other process gas such as hydrogen may be supplied to the first oxidation process P2.

The first oxidation process P2 may be a wet oxidation process or a dry oxidation process. According to an embodiment of the present invention, preferably, the first oxidation process P2 is a wet oxidation process, such as an in-situ steam generation (ISSG) oxidation process. A processing temperature of the first oxidation process P2 may be between 800° C. and 1200° C., but is not limited thereto. A processing time of the first oxidation process P2 may be, depending on the required thicknesses of the first oxide layer 120P and the second oxide layer 120N, between 1 minute and 12 minutes, but is not limited thereto.

During the first oxidation process P2, a portion of the upper portion 112-1 of the doped layer 112 are oxidized to form the first oxide layer 120P. According to an embodiment of the present invention, the first oxide layer 120P may include a portion of the nitrogen dopants N. A surface layer of the N-type device region 100N of the substrate 100 is oxidized to form the second oxide layer 120N during the first oxidation process P2. The second oxide layer 120N does not include any nitrogen dopant N.

As shown in FIG. 4, the first oxide layer 120P has a thickness T1, and the second oxide layer 120N has a thickness T2. According to an embodiment of the present invention, the thickness T1 and the thickness T2 are approximately the same. For example, the thickness T1 and the thickness T2 may be between between 55 Å and 60 Å, but are not limited thereto.

According to an embodiment of the present invention, before the first oxidation process P2, a well implant process (not shown) may be performed to implant suitable well dopants into the N-type device region 100N of the substrate 100 to form a well region (not shown). The well implant process may be performed before the implantation process P1 or after the implantation process P1 according to process needs.

Figure 5:
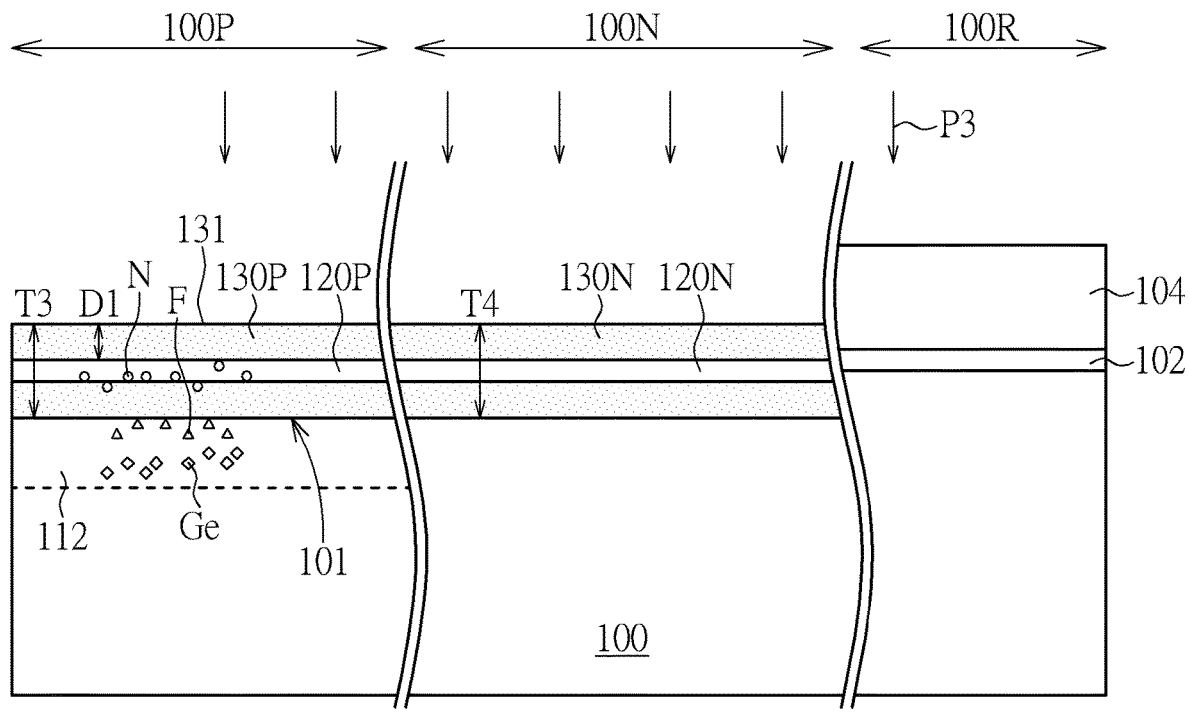

Please refer to FIG. 5. Subsequently, the substrate 100 is placed in an oxygen-containing ambient and a second oxidation process P3 is performed when the P-type device region 100P of the substrate 100 is covered by the first oxide layer 120P and the N-type device region 100N of the substrate 100 is covered by the second oxide layer 120N. During the second oxidation process P3, oxygen or oxygen-containing compounds (such as O—H) of the reaction gas may penetrate through the first oxide layer 120P and the second oxide layer 120N to further oxidize the P-type device region 100P and the N-type device region 100N of the substrate 100 (oxidize the silicon of the substrate 100 under the first oxide layer 120P and the second oxide layer 120N), thereby simultaneously forming a first gate oxide layer 130P on the P-type device region 100P of the substrate 100 and a second gate oxide layer 130N on the N-type device region 100N of the substrate 100.

The second oxidation process P3 may be a wet oxidation process or a dry oxidation process. According to an embodiment of the present invention, preferably, the second oxidation process P3 is a wet furnace oxidation process. A processing temperature of the second oxidation process P3 may be between 800° C. and 1200° C., but is not limited thereto. A processing time of the second oxidation process P3 may be, depending on the required thicknesses of the first gate oxide layer 130P and the second gate oxide layer 130N, between 30 minutes and 2 hours, but is not limited thereto. According to an embodiment of the present invention, during the second oxidation process P3, the first oxide layer 120P and the second oxide layer 120N may prevent the implanted dopants from outgassing from the substrate 100. According to an embodiment of the present invention, during the second oxidation process P3, the peripheral region 100R is covered by the pad layer 102 and the hard mask layer 104, and is not oxidized.

As shown in FIG. 5, the first gate oxide layer 130P has a thickness T3, and the second gate oxide layer 130N has a thickness T4. According to an embodiment of the present invention, the thickness T3 and the thickness T4 may respectively between hundreds of angstroms (Å) and several micrometers (um), but are not limited thereto.

It should be noted that, in FIG. 5, the first oxide layer 120P and the second oxide layer 120N are respectively shown in the first gate oxide layer 130P and the second gate oxide layer 130N in order to illustrate the feature that the first gate oxide layer 130P and the second gate oxide layer 130N are formed by oxidizing the substrate 100 (the silicon of the substrate 100) through the first oxide layer 120P and the second oxide layer 120N during the second oxidation process P3. Substantially, the first oxide layer 120P, first gate oxide layer 130P, the second oxide layer 120N, and the second gate oxide layer 130N are all made from oxidizing the substrate 100 and comprise the same material, such as silicon oxide ($SiO_2$). The boundary between the first oxide layer 120P and first gate oxide layer 130P and the boundary between the second oxide layer 120N and the second gate oxide layer 130N are not distinguishable. In other words, after the during the second oxidation process P3, the first oxide layer 120P may become a portion of the first gate oxide layer 130P, and the second oxide layer 120N may become a portion of the second gate oxide layer 130N.

It is known that different doping conditions may cause different oxidation rates in different device regions during the oxidation processes and may influence the process window of subsequent manufacturing steps. One feature of the present invention is to co-implant nitrogen dopants N in a suitable dosage into the P-type device region 100P during the step of implanting germanium dopants Ge into the P-type device region 100P, such that the influence of the germanium dopants Ge on the oxidation rate and the influence of the nitrogen dopants N on the oxidation rate may be added to provide an oxidation rate of P-type device region 100P of the substrate 100 approximately equals to an oxidation rate of the N-type device region 100N of the substrate 100 that does not including the nitrogen dopants N and the germanium dopants Ge. In this way, after the first oxidation process P2 and the second oxidation process P3, the thickness T3 of the first gate oxide layer 130P and the thickness T4 of the second gate oxide layer 130N may be approximately the same. For example, the thickness T3 of the first gate oxide layer 130P and the thickness T4 of the second gate oxide layer 130N may be between approximately 740 Å and 780 Å, or may be approximately 760±20 Å, but are not limited thereto.

Another feature of the present invention is that, the upper portion 112-1 of the doped layer 112 with the nitrogen dopants N is oxidized by the first oxidation process P2 to form the first oxide layer 120P having the nitrogen dopants N, and the first oxide layer 120P is then turned into a portion of the first gate oxide layer 130P after the second oxidation process P3. Accordingly, the first gate oxide layer 130P will have the nitrogen dopants N, while the second gate oxide layer 130N does not have the nitrogen dopants N. According to an embodiment of the present invention, the location of the nitrogen dopants N in the first gate oxide layer 130P may be approximately equal to the location of the first oxidation process P2 shown in FIG. 4, and is at a depth D1 below a surface 131 of the first gate oxide layer 130P. According to an embodiment of the present invention, the depth D1 is approximately 40% to 45% of the thickness T3 of the first gate oxide layer 130P. For example, the thickness T3 of the first gate oxide layer 130P may be between approximately 740 Å and 780 Å, and the depth D1 of the nitrogen dopants N may be between approximately 300 Å and 350 Å. As shown in FIG. 5, during the second oxidation process P3, the fluorine dopants F of the doped layer 112 may diffuse upward toward an interface 101 between substrate 100 and the first gate oxide layer 130P. The germanium dopants Ge of the doped layer 112 may diffuse upward to a location approximately below the fluorine dopants F during the second oxidation process P3.

Figure 6:
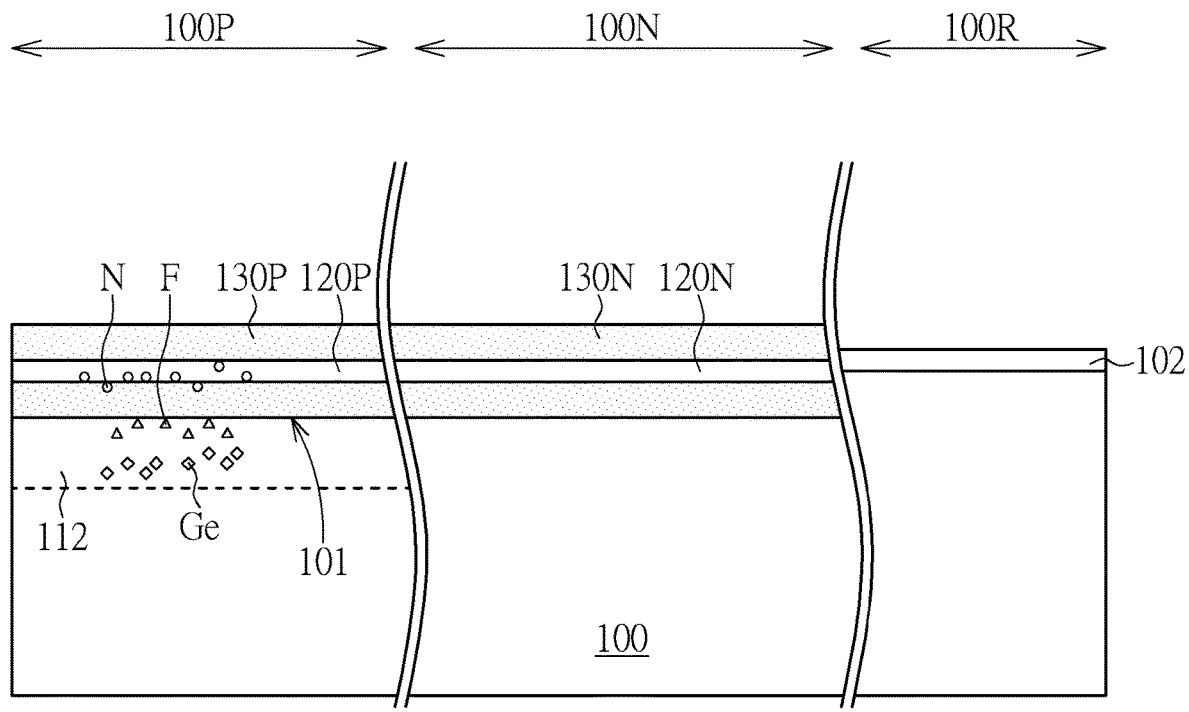

Please refer to FIG. 6. Subsequently, a removal process such as a wet etching process or a dry etching process may be performed to remove the hard mask layer 104 on the peripheral region 100R of the substrate 100. The pad layer 102 may remain on the peripheral region 100R of the substrate 100 after the removal process.

Figure 7:
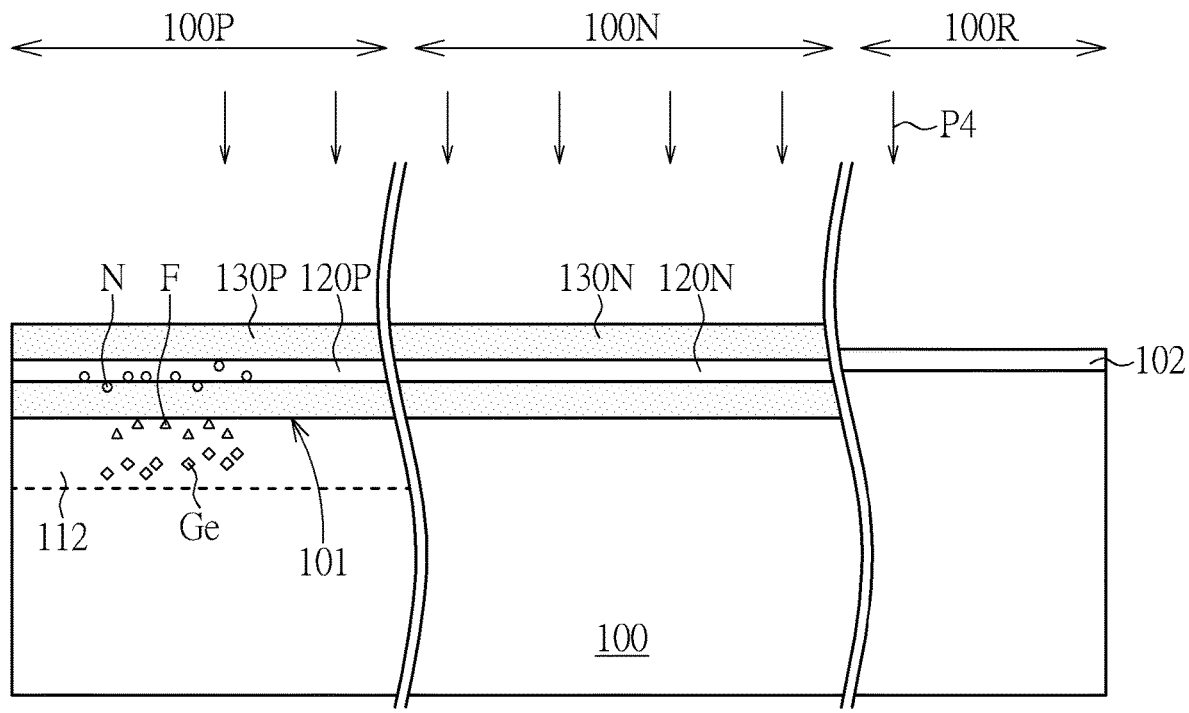

Please refer to FIG. 7. After removing the hard mask layer 104 on the peripheral region 100R of the substrate 100, a rapid thermal process P4 may be performed to the substrate 100 when the P-type device region 100P of the substrate 100 is covered by the first gate oxide layer 130P and the N-type device region 100N of the substrate 100 is covered by the second gate oxide layer 130N. According to an embodiment of the present invention, the peripheral region 100R of the substrate 100 is covered by the pad layer 102 during the rapid thermal process P4. According to an embodiment of the present invention, the substrate 100 is in an inert gas ambient during the rapid thermal process P4. The inert gas ambient may be obtained by supplying inert gas, such as nitrogen (N$_2$) or argon (Ar), into the processing chamber of the rapid thermal process P4, but is not limited thereto.

According to an embodiment of the present invention, a processing temperature of the rapid thermal process P4 may be between 850° C. and 1050° C., and a processing time of the rapid thermal process P4 may be between 15 seconds and 5 minutes, but are not limited thereto. The rapid thermal process P4 may activate the dopants in the substrate 100 and repair the damaged portion of the substrate 100 after the implantation process (such as the implantation process P1 and the well implant process on the N-type device region).

According to an embodiment of the present invention, during the rapid thermal process P4, the germanium dopants Ge of the doped layer 112 may diffuse upward to be closer to the interface 101, and are still below the fluorine dopants F. According to a preferred embodiment of the present invention, after the rapid thermal process P4, a concentration of the germanium dopants Ge near the interface 101 is larger than 1E21 atoms/cm$^3$, a concentration of the fluorine dopants F near the interface 101 is larger than 1E20 atoms/cm$^3$, and a concentration of the nitrogen dopants N in the first gate oxide layer 130P is larger than 1E21 atoms/cm$^3$.

Figure 8:
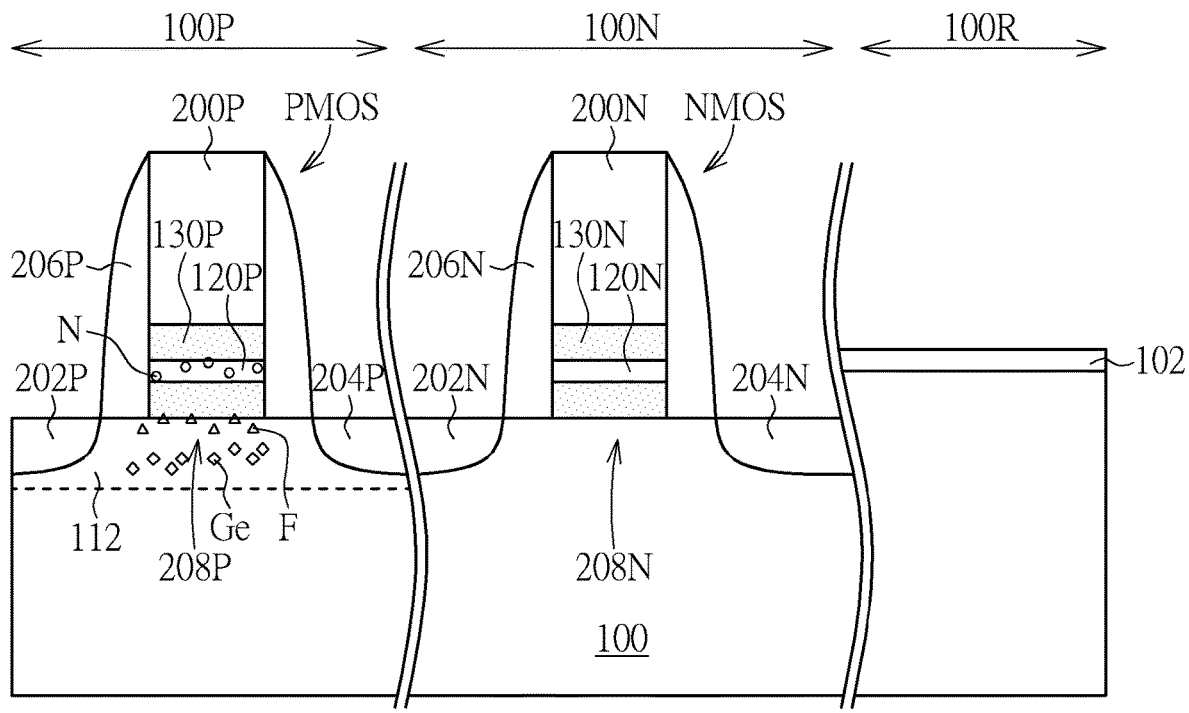

Please refer to FIG. 8. Following, a first gate structure 200P and a second gate structure 200N are formed on the first gate oxide layer 130P and the second gate oxide layer 130N, respectively. After that, a first source region 202P of a P-type conductivity and a first drain region 204P of the P-type conductivity are formed in the P-type device region 100P of the substrate 100 and at two sides of the first gate structure 200P to form a P-type device PMOS. A second source region 202N of an N-type conductivity and a second drain region 204N of the N-type conductivity are formed in the N-type device region 100N of the substrate 100 and at two sides of the second gate structure 200N to form an N-type device NMOS.

According to an embodiment of the present invention, before forming the source regions and the drain regions, a portion of the first gate oxide layer 130P not covered by the first gate structure 200P and a portion of the second gate oxide layer 130N not covered by the second gate structure 200N may be etched away. Following, a first spacer 206P may be formed on the sidewalls of the first gate structure 200P and the first gate oxide layer 130P under the first gate structure 200P. A second spacer 206N may be formed on the sidewalls of the second gate structure 200N and the second gate oxide layer 130N under the second gate structure 200N. It should be noted that, optionally, the peripheral region 100R may have semiconductor structures formed thereon during the processes for forming the P-type device PMOS and the N-type device NMOS. For the sake of simplicity, those semiconductor structures are not shown in the drawings.

According to an embodiment of the present invention, the first source region 202P and the first drain region 204P are formed in the doped region 112 in the P-type device region 100P of the substrate 100. A first channel region 208P of the P-type device PMOS is located between the first source region 202P and the first drain region 204P and may include the germanium dopants Ge and the fluorine dopants F. The germanium dopants Ge and the fluorine dopants F in the P-type device PMOS may increase the carrier mobility and improve the negative bias temperature instability (NBTI) of the P-type device PMOS. The second source region 202N and the second drain region 204N are formed in the N-type device region 100N (or a well region) of the substrate 100. A second channel region 208N of the N-type device NMOS is located between the second source region 202N and the second drain region 204N and does not include the germanium dopants Ge or the fluorine dopants F.

In summary, the present invention implants germanium dopants and nitrogen dopants into the P-type device region of the substrate to improve the electrical characteristics of the P-type device and also ensure the thickness of the gate oxide layer on the P-type device region to be approximately equal to the thickness of the gate oxide layer on the N-type device region of the substrate. In this way, it would be easier to control the process to produce a gate oxide layer on the P-type with a desired thickness while the gate oxide layer on the N-type device region achieves a target thickness. Furthermore, the gate-height of the P-type device on the P-type device region and the gate-height of the N-type device on the N-type device region may be more comparable and a larger process window of subsequently manufacturing steps may be obtained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate, having a P-type device region and an N-type device region, wherein the P-type device region comprises germanium dopants;
    a first gate oxide layer formed on the P-type device region;
    a second gate oxide layer formed on the N-type device region, wherein the first gate oxide layer comprises nitrogen dopants, and the second gate oxide layer does not comprise the nitrogen dopants, wherein a thickness of the first gate oxide layer is between 740 Å and 780 Å, and a middle portion of the first gate oxide layer has a nitrogen concentration larger than a nitrogen concentration of any portion of the first gate oxide layer between the middle portion and the substrate, wherein the middle portion is at a depth below a surface of the first gate oxide layer, and the depth is 40% to 45% of a thickness of the first gate oxide layer; and
    a first gate structure disposed on the first gate oxide layer and directly contacting the surface of the first gate oxide layer.

2. The semiconductor device according to claim 1, wherein a thickness of the first gate oxide layer and a thickness of the second gate oxide layer are approximately the same.

3. The semiconductor device according to claim 1, wherein a concentration of the nitrogen dopants is larger than 1E21 atoms/cm$^3$.

4. The semiconductor device according to claim 1, further comprising:
    a first source region and a first drain region formed in the P-type device region of the substrate and at two sides of the first gate structure, wherein the first source region and the first drain region are of a P-type conductivity;
    a second gate structure disposed on the second gate oxide layer; and
    a second source region and a second drain region formed in the N-type device region of the substrate and at two sides of the second gate structure, wherein the second source region and the second drain region are of an N-type conductivity.

5. The semiconductor device according to claim 4, wherein the germanium dopants are between the first source region and the first drain region, and a concentration of the germanium dopants is larger than 1E21 atoms/cm$^3$.

6. The semiconductor device according to claim 5, further comprising fluorine dopants in the P-type device region of the substrate and between the first source region and the first drain region, and a concentration of the fluorine dopants is larger than 1E20 atoms/cm$^3$.

7. The semiconductor device according to claim 6, wherein a depth of the germanium dopants below a surface of the substrate is larger than a depth of the fluorine dopants below the surface of the substrate.

\* \* \* \* \*